(12) United States Patent
Kim

(10) Patent No.: US 10,853,156 B2
(45) Date of Patent: Dec. 1, 2020

(54) DISPLAY DEVICE CAPABLE OF PERFORMING SELF DIAGNOSIS IN RELATION TO PARTIAL DISCHARGE

(71) Applicant: LSIS CO., LTD., Anyang-si (KR)

(72) Inventor: Byung-Chul Kim, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 140 days.

(21) Appl. No.: 16/130,318

(22) Filed: Sep. 13, 2018

(65) Prior Publication Data

US 2019/0170806 A1 Jun. 6, 2019

(30) Foreign Application Priority Data

Dec. 1, 2017 (KR) .................. 10-2017-0164260

(51) Int. Cl.
G06F 11/00 (2006.01)
G06F 11/07 (2006.01)
G02F 1/13 (2006.01)
G01R 31/26 (2020.01)
G01R 31/44 (2020.01)
G01R 31/12 (2020.01)
(Continued)

(52) U.S. Cl.
CPC .......... *G06F 11/0703* (2013.01); *G01R 31/12* (2013.01); *G01R 31/2635* (2013.01); *G01R 31/44* (2013.01); *G02F 1/1309* (2013.01); *G06F 3/1415* (2013.01); *G06F 11/079* (2013.01); *G06F 11/0751* (2013.01); *G06F 11/0766* (2013.01); *G09G 3/006* (2013.01)

(58) Field of Classification Search
CPC ............. G06F 11/0703; G06F 11/0751; G06F 11/0766; G06F 11/079; G06F 3/1415; G01R 31/12; G01R 31/2635; G01R 31/44; G02F 3/1415; G09G 3/006
See application file for complete search history.

(56) References Cited

U.S. PATENT DOCUMENTS

2003/0122749 A1 7/2003 Booth, Jr. et al.
2005/0030058 A1* 2/2005 Li .................. G09G 3/006
324/760.01
(Continued)

FOREIGN PATENT DOCUMENTS

EP 1335430 A1 8/2003
JP 2008216334 A 9/2008
(Continued)

OTHER PUBLICATIONS

European Search Report for related European Application No. 18194136.0; action dated Mar. 28, 2019; (9 pages).
(Continued)

*Primary Examiner* — Joseph D Manoskey
(74) *Attorney, Agent, or Firm* — K&L Gates LLP

(57) ABSTRACT

A display device may include an image processor which is configured to process an image signal and includes a detector configured to determine a group of parameters by detecting a waveform of a detected partial discharge and measuring each of parameters of the waveform in the form of a binary number and a controller configured to identify the partial discharge by comparing the determined group with previously stored groups; and a display unit configured to display the image signal.

11 Claims, 4 Drawing Sheets

(51) Int. Cl.
*G06F 3/14* (2006.01)
*G09G 3/00* (2006.01)

(56) References Cited

U.S. PATENT DOCUMENTS

| | | | | |
|---|---|---|---|---|
| 2006/0279321 | A1* | 12/2006 | Ruppender | G09G 3/006 |
| | | | | 324/750.3 |
| 2008/0157988 | A1* | 7/2008 | Lai | G01R 31/1272 |
| | | | | 340/635 |
| 2015/0054524 | A1* | 2/2015 | Kobayashi | G01R 31/1227 |
| | | | | 324/551 |
| 2016/0055778 | A1 | 2/2016 | Kim | |
| 2018/0315363 | A1* | 11/2018 | Abbott | G06F 11/24 |

FOREIGN PATENT DOCUMENTS

| | | |
|---|---|---|
| KR | 20160041408 A | 4/2016 |
| KR | 20160046014 A | 4/2016 |

OTHER PUBLICATIONS

Korean Office Action for related Korean Application No. 10-2017-0164260; action dated Jan. 21, 2019; (4 pages).

\* cited by examiner

FIG. 3
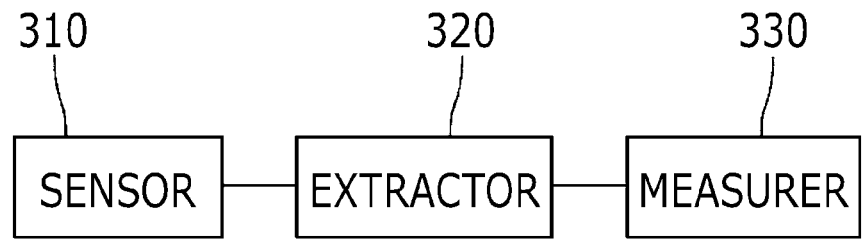
FIG. 4
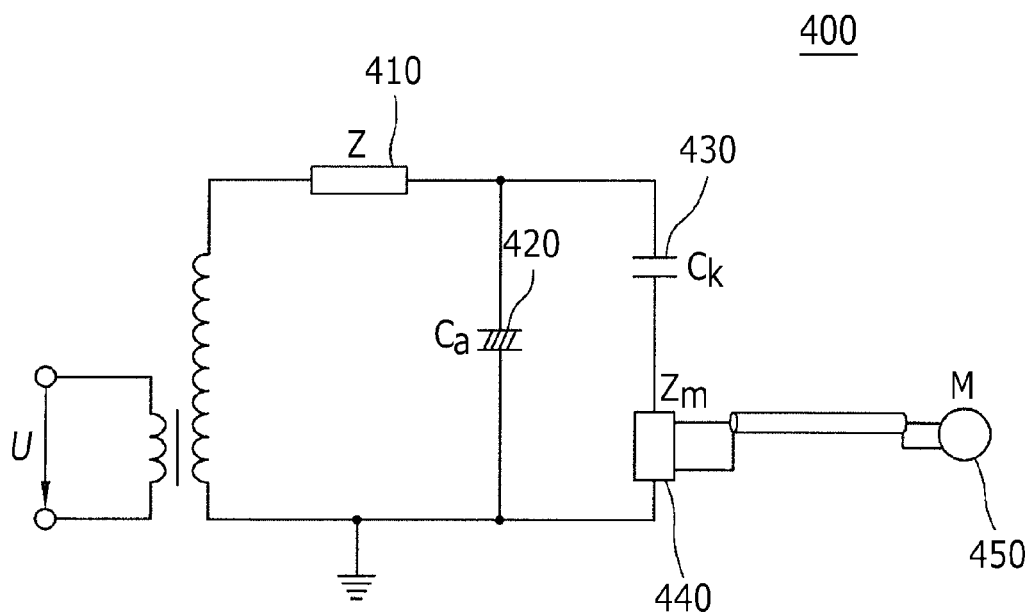
FIG. 5
A(1 1 1 0 0 0)
B(0 0 1 0 1 0)
C(1 0 0 0 0 0)
D(0 0 1 0 1 1)

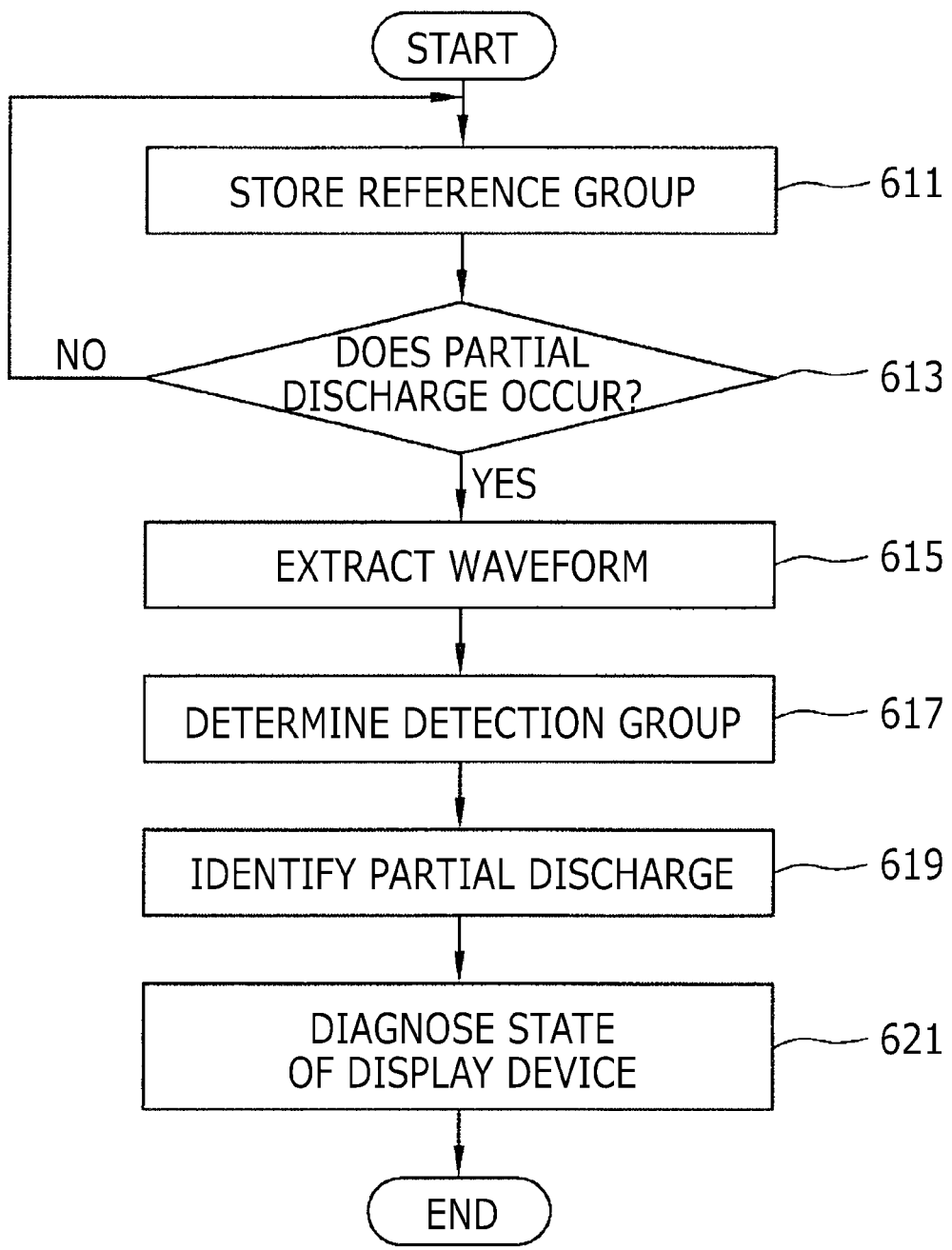

DISPLAY DEVICE CAPABLE OF PERFORMING SELF DIAGNOSIS IN RELATION TO PARTIAL DISCHARGE

CROSS-REFERENCE TO RELATED APPLICATION

Pursuant to 35 U.S.C. § 119(a), this application claims the benefit of earlier filing date and right of priority to Korean Application No. 10-2017-0164260, filed on 1 Dec. 2017, the disclosure of which is incorporated herein by reference in its entirety.

BACKGROUND

1. Field of the Invention

The present disclosure relates to a display device capable of performing a self-diagnosis in relation to a partial discharge.

2. Discussion of Related Art

Generally, a partial discharge may occur in a display device. That is, when a high electric field is concentrated on a particular portion of the display device, the partial discharge may occur at the particular portion of the display device on which the high electric field is concentrated.

For example, the partial discharge may include at least one among a corona discharge, a surface discharge, and a void discharge.

The display device may be deteriorated due to the partial discharge. When the partial discharge repeatedly occurs, a dielectric breakdown may occur in the display device. The dielectric breakdown may be a cause of malfunction of display device.

SUMMARY OF THE INVENTION

The present disclosure is directed to a display device capable of performing a self-diagnosis in relation to a partial discharge and preventing a malfunction thereof. Aspects of the present disclosure are not limited thereto, and additional aspects and advantages of the present disclosure which are not mentioned herein may be understood from the following description and will be apparent from embodiments of the present disclosure. Furthermore, it will be apparent that the aspects and advantages of the present disclosure can be implemented by means defined in the claims and a combination of the means.

To address the above-described problems, according to an aspect of the present disclosure, a display device includes an image processor configured to process an image signal, and a display unit configured to display the processed image signal.

The image processor may include a detector configured to determine a group of parameters by detecting a waveform of a detected partial discharge and measuring each of parameters of the waveform in the form of a binary number, and a controller configured to identify the detected partial discharge by comparing the determined group with previously stored groups.

The controller may include an arithmetic unit configured to update the previously stored groups by performing an operation on at least one among the previously stored groups.

The arithmetic unit may be further configured to perform at least one of a selection operation of selecting at least one first group from among the previously stored groups, a crossover operation of generating a second group by combining parameters of at least two groups among the previously stored groups, a mutation operation of generating a third group by changing at least one of parameters of the first or second group, and a substitution operation of replacing one of the previously stored groups with the first group, the second group, or the third group.

The parameters may include at least one of a phase of the partial discharge, a magnitude of the partial discharge, a frequency of occurrence of the partial discharge, a maximum magnitude of the partial discharge, an average discharge amount, a firing voltage, and an extinction voltage.

The image processor may further include a memory in which identification information of the partial discharge is mapped to each of the previously stored groups.

The identification information may include at least one of a cause of the partial discharge, a location at which the partial discharge has occurred, and a degree of risk of the partial discharge.

The controller may be further configured to diagnose a state of the display device on the basis of the identification information of the detected partial discharge.

The controller may output an alarm message or power off the display device on the basis of the identification information of the detected partial discharge.

The detector may include a first impedance element configured to decrease an output impedance when the partial discharge occurs, a first condenser in which a dielectric breakdown occurs when the output impedance of the first impedance element decreases, a second condenser of which an output voltage increases when the dielectric breakdown occurs in the first condenser, a second impedance element to which the increased output voltage of the second condenser is applied, and a sensing element configured to sense the occurring partial discharge on the basis of a voltage input from the second impedance element.

The image processor may further include a converter configured to output the image signal in the form of digital data to the display unit.

The detector may detect a partial discharge occurring in the converter.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 3 is a block diagram of a detector of FIG. 2;

FIG. 4 is a circuit diagram of a sensor of FIG. 3;

FIGS. 5 and 6 are diagrams illustrating examples of a memory and a controller of FIG. 2; and FIG. 7 is a flowchart of a process of performing a self-diagnosis in relation to a partial discharge, the process being performed by a display device, according to an embodiment of the present disclosure.

DETAILED DESCRIPTION OF EXEMPLARY EMBODIMENTS

Figure 1:
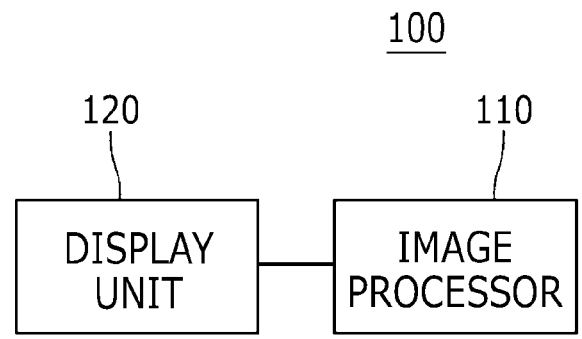
FIG. 1 is a block diagram illustrating an internal structure of a display device according to an embodiment of the present disclosure.

Hereinafter, exemplary embodiments of the present disclosure will be described in detail below with reference to the accompanying drawings. However, the technology set forth herein should not be construed as being limited thereto and should be understood to cover various modifications, equivalents, and/or alternatives. In relation to describing drawings, like elements may be denoted by like reference numerals.

As used herein, the terms such as "include", "may include", "comprise", and "may comprise" specify the presence of stated features, values, functions, and elements, e.g., components, but do not preclude the presence or addition of one or more other features, values, functions, and elements.

The terms such as "first" or "second" may be used herein to describe various elements regardless of an order and/or importance, and these elements should not be limited by these terms. These terms are only used to distinguish one element from another element.

FIG. 1 is a block diagram illustrating an internal structure of a display device 100 according to an embodiment of the present disclosure.

Referring to FIG. 1, the display device 100 according to an embodiment of the present disclosure may display an image signal received from an external device (not shown). To this end, the display device 100 may be connected to the external device via wire or wirelessly. The display device 100 may interface with the external device and receive the image signal from the external device. For example, the external device may include a circuit breaker, and the display device 100 may be a liquid crystal display (LCD) device. That is, the display device 100 may include a display unit 120 and an image processor 110.

The display unit 120 may display the image signal. For example, the display unit 120 may include an LCD panel.

The image processor 110 may control overall operations of the display device 100. In this case, the image processor 110 may control the display unit 120. Furthermore, the image processor 110 may output the image signal received from the external device to the display unit 120. Here, the image processor 110 may process the image signal according to features and a size of the display unit 120.

In one embodiment of the present disclosure, the image processor 110 may identify a partial discharge occurring therein and perform a self-diagnosis. In this case, the image processor 110 may control the display device 100 in response to the partial discharge.

Figure 2:
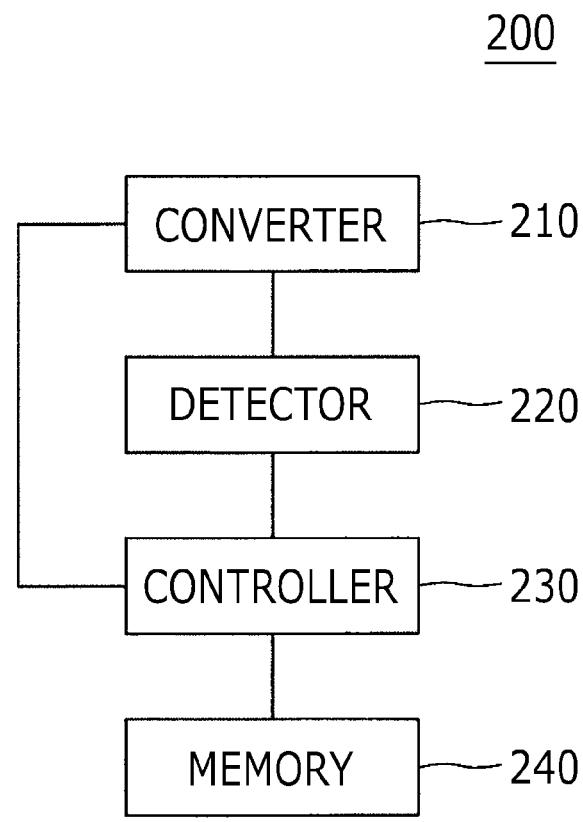
FIG. 2 is a block diagram illustrating an internal structure of an image processor according to an embodiment of the present disclosure.
Figure 6:
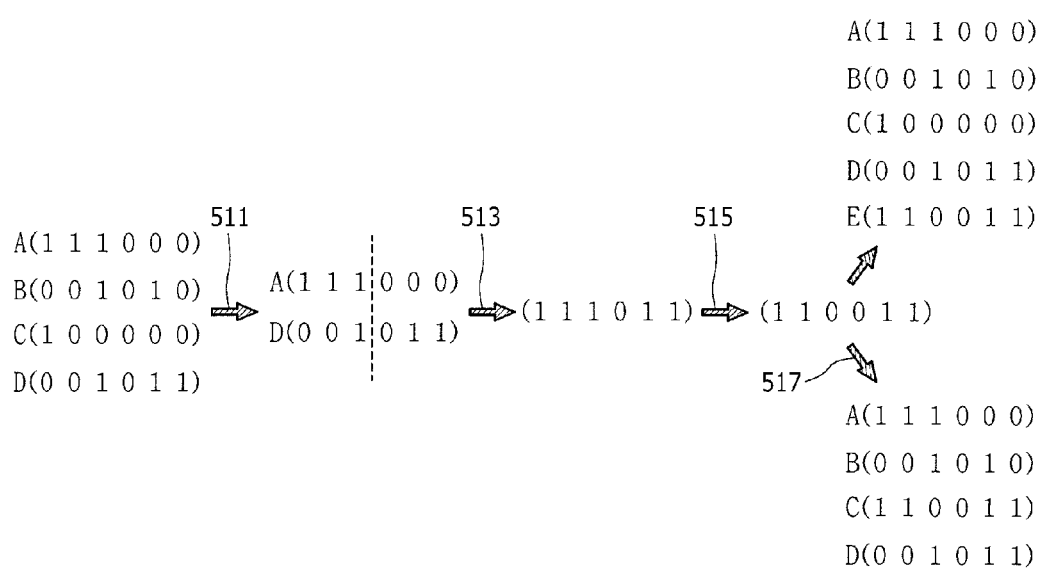

FIG. 2 is a block diagram illustrating an internal structure of the image processor 110 according to an embodiment of the present disclosure. FIG. 3 is a block diagram of a detector of FIG. 2. FIG. 4 is a circuit diagram of a sensor of FIG. 3. FIGS. 5 and 6 are diagrams illustrating examples of a memory and a controller of FIG. 2.

Referring to FIG. 2, an image processor 200 (or the image processor 110 of FIG. 1 according to an embodiment of the present disclosure may include a converter 210, a detector 220, a controller 230, and a memory 240.

The converter 210 may convert an image signal according to features and a size of the display unit 120 of FIG. 1. Furthermore, the converter 210 may output the image signal to the display unit 120. In this case, the converter 210 may output the image signal in the form of digital data. To this end, the converter 210 may be formed by mounting a plurality of components on a substrate.

In one embodiment, the converter 210 may include an image decoder, an analog-digital converter (ADC), a scaler, and a power supply.

The image decoder may decode the image signal.

The ADC may receive a synchronization signal and an RGB signal corresponding to the image signal, and convert the RGB signal from an analog signal to digital data on the basis of the synchronization signal.

The scaler may scale the image signal and the RGB signal and output the scaled image signal and RGB signal to the display unit 120.

The power supply may supply power to the display unit 120.

In one embodiment of the present disclosure, a partial discharge may occur in the converter 210. That is, when a high electric field is concentrated at a particular portion of the converter 210, the partial discharge may occur at the particular portion of the converter 210 on which the high electric field is concentrated. In this case, the partial discharge may occur at various locations and due to various causes.

For example, the partial discharge may include at least one among a corona discharge, a surface discharge, and a void discharge. Thus, the particular portion of the converter 210 at which the partial discharge occurs may deteriorate. As the partial discharge repeatedly occurs, a dielectric breakdown may occur in the converter 210. The dielectric breakdown may be a cause of malfunction of the display device 100.

The detector 220 may detect the partial discharge occurring in the converter 210 by detecting a waveform of the partial discharge. Here, the detector 220 may measure the waveform of the partial discharge in the form of data consisting of a plurality of bits.

As illustrated in FIG. 3, a detector 300 (or the detector 220 of FIG. 2) may include a sensor 310, an extractor 320, and a measurer 330.

The sensor 310 may sense a partial discharge occurring in the converter 210. In this case, the sensor 310 may sense the partial discharge in response to an input signal from the converter 210. For example, the sensor 310 may include a ceramic coupler.

As illustrated in FIG. 4, a sensor 400 (or the sensor 310 of FIG. 3) may include a first impedance element 410, a first condenser 420, a second condenser 430, a second impedance element 440, and a sensing element 450.

The first impedance element 410 may respond to a partial discharge. That is, when a partial discharge occurs in the converter 210, an output impedance of the first impedance element 410 may decrease.

The first condenser 420 may be connected in series to the first impedance element 410. When the output impedance of the first impedance element 410 decreases, a dielectric breakdown may occur in the first condenser 420.

The second condenser 430 may be connected in series to the first impedance element 410 and connected in parallel to the first condenser 420. When a dielectric breakdown occurs in the first condenser 420, an output voltage of the second condenser 430 may increase.

The second impedance element 440 may be connected in series to the second condenser 430. That is, the output voltage of the second condenser 430 may be applied to the second impedance element 440.

The sensing element 450 may be connected to the second impedance element 440. The sensing element 450 may sense the partial discharge on the basis of a voltage input from the second impedance element 440.

The extractor 320 may extract a waveform of the partial discharge. In this case, the extractor 320 may extract the waveform of the partial discharge by removing a noise signal from an input signal. For example, the extractor 320 may include a finite impulse response (FIR) filter.

The measurer 330 may measure a predetermined number of parameters, e.g., N parameters, from the waveform of the partial discharge. For example, the parameters may include at least one among a phase of the partial discharge, a magnitude of the partial discharge, a frequency of occurrence of the partial discharge, a maximum intensity of the partial discharge, an average discharge amount, a firing voltage, and an extinction voltage.

The measurer 330 may determine a group of parameters on the basis of a genetic algorithm. That is, the measurer 330 may measure each of the parameters in the form of a binary number. Here, the measurer 330 may measure each of the parameters in the form of a bit and express each of the parameters as 0 or 1. For example, the measurer 330 may determine a bit corresponding to each of the parameters according to whether each of the parameters is greater than a predetermined threshold value. Furthermore, the measurer 330 may determine the group of the parameters by consecutively arranging the bits corresponding to the parameters in a predetermined order. The term "detection group" to be described below may be understood as a group determined by the measurer 330. For example, the detection group may be expressed as (0 0 1 0 1 1).

The memory 240 may store programs for operating the display device 100. In this case, the memory 240 may store a program for detecting a partial discharge occurring in the converter 210.

The memory 240 may store data generated during execution of the programs.

Furthermore, the memory 240 may store a plurality of groups each representing waveforms of partial discharges which may occur in the converter 210. The term "reference group" to be described below may be understood as a group stored in the memory 240.

For example, as illustrated in FIG. 5, the memory 240 may store a plurality of reference groups A, B, C and D. Here, each of the reference groups A, B, C and D may be formed based on the genetic algorithm. That is, each of the reference groups A, B, C and D may consist of bits determined to correspond to a predetermined number of parameters, e.g., N parameters, from one of waveforms. Here, the bits may be consecutively arranged in the predetermined order. Each of the parameters may correspond to one of the bits expressed in the form of a binary number, i.e., 0 or 1.

Furthermore, the memory 240 may store identification information identifying a partial discharge which may occur in the converter 210 to be mapped to one of the reference groups. Here, the identification information may include at least one among a cause of the partial discharge, a location at which the partial discharge has occurred, and a degree of risk of the partial discharge. For example, the degree of risk of the partial discharge may vary according to at least one among the cause of the partial discharge, the location on the converter 210 at which the partial discharge has occurred, and a frequency of occurrence of the partial discharge.

The controller 230 may control overall operations of the display device 100 of FIG. 1. Furthermore, the controller 230 may identify a partial discharge detected in the converter 210. To this end, the controller 230 may compare a detection group with the reference groups.

That is, the controller 230 may determine whether the detection group is identical to one of the reference groups. When the detection group is identical to one of the reference groups, the controller 230 may check identification information of the reference group identical to the detection group. Here, the controller 230 may update the identification information of the reference group identical to the detection group. For example, when the detection group is identical to the reference group B, the controller 230 may increase a degree of risk of the reference group B.

In addition, the controller 230 may diagnose a state of the display device 100 in response to the partial discharge. Here, the controller 230 may diagnose the state of the display device 100 on the basis of the identification information of the reference group identical to the detection group.

To this end, the controller 230 may predict a degree of deterioration of the converter 210 by analyzing the identification information of the reference group identical to the detection group. For example, the controller 230 may predict the degree of deterioration of the converter 210 on the basis of at least one among the cause of the partial discharge, the location at which the partial discharge has occurred, and the degree of risk of the partial discharge.

The controller 230 may diagnose the degree of deterioration of the converter 210 by comparing the degree of risk of the partial discharge with at least one predetermined threshold value.

For example, when the degree of risk of the partial discharge is greater than or equal to the at least one predetermined threshold value, the controller 230 may output an alarm message to repair, inspect, or replace the converter 210. The controller 230 may transmit the alarm message to an external device or display the alarm message via the display unit 120.

When the degree of risk of the partial discharge is greater than or equal to the at least one predetermined threshold value, the controller 230 may power off the display device 100.

The controller 230 may output the alarm message when the degree of risk of the partial discharge is greater than or equal to a first threshold value and is less than a second threshold value which is greater than the first threshold value.

When the degree of risk of the partial discharge is greater than or equal to the second threshold value, the controller 230 may power off the display device 100. Alternatively, when the degree of risk of the partial discharge is greater than or equal to the second threshold value, the controller 230 may output the alarm message and power off the display device 100. That is, the controller 230 may output the alarm message or power off the display device 100 on the basis of the degree of risk of the partial discharge which is identification information of the partial discharge.

The controller 230 may update the reference groups on the basis of the genetic algorithm. To this end, the controller 230 may include an arithmetic unit (not shown). The arithmetic unit may perform an operation on at least one of the reference groups.

In this case, the arithmetic unit may perform at least one among a selection operation 511, a crossover operation 513, a mutation operation 515, and a substitution operation 517 as illustrated in FIG. 6. The arithmetic unit may perform the selection operation 511 to select at least one of the reference groups, i.e., a first group. For example, the arithmetic unit may select the reference groups A and D.

The arithmetic unit may perform the crossover operation 513 to generate a second group by combining at least two groups from among the reference groups. For example, the arithmetic unit may divide the bits of each of the reference group A and the reference group D into two regions by a predetermined line of intersection. Here, the bits of each of the reference group A and the reference group D may be divided into a first region at one side of the line of intersection and a second region at another side of the line of intersection.

Thereafter, the arithmetic unit may cross one of the regions of the reference group A, e.g., a first region, and one of the regions of the reference group D, e.g., a second region.

The arithmetic unit may perform the mutation operation 515 to generate a third group by changing at least one of the first group and the second group. For example, the arithmetic unit may change at least one bit corresponding to a predetermined location among the bits to a predetermined value, e.g., 0 or 1.

By changing the at least one bit, the arithmetic unit may add the first group, the second group, or the third group as a new reference group. For example, the arithmetic unit may add a reference group E. The arithmetic unit may perform the substitution operation 517 to replace one of the reference groups with one of the first to third groups. For example, the arithmetic unit may change the reference group C.

FIG. 7 is a flowchart of a process of performing a self-diagnosis in relation to a partial discharge, the process performed by the display device 100, according to an embodiment of the present disclosure.

Referring to FIG. 7, in the process of performing a self-diagnosis in relation to a partial discharge, the process performed by the display device 100 of FIG. 1, first, in operation 611, the memory 240 of FIG. 2 may store a plurality of reference groups. The plurality of reference groups may represent waveforms of partial discharges which may occur in the converter 210 of FIG. 2.

In this case, each of the plurality of reference groups may be formed based on the genetic algorithm. That is, each of the plurality of reference groups may consist of bits determined to correspond to a predetermined number of parameters, e.g., N parameters, from one of the waveforms. Here, the bits may be consecutively arranged in a predetermined order. Each of the parameters may correspond to one of the bits, expressed in the form of a binary number, i.e., 0 or 1.

The memory 240 may store identification information to be mapped to each of the plurality of reference groups. Here, the identification information may include at least one among a cause of a partial discharge, a location at which the partial discharge has occurred, and a degree of risk of the partial discharge. For example, the degree of risk of the partial discharge may vary according to at least one of the cause of the partial discharge, the location at which the partial discharge has occurred, and a frequency of occurrence of the partial discharge. For example, the memory 240 may store the plurality of reference groups as illustrated in FIG. 5.

The controller 230 of FIG. 2 may update the plurality of reference groups stored in the memory 240 on the basis of the genetic algorithm. To this end, the controller 230 may perform an operation on at least one of the plurality of reference groups. For example, the controller 230 may perform at least one among the selection operation 511, the crossover operation 513, the mutation operation 515, and the substitution operation 517 as illustrated in FIG. 6.

Next, in operation 613, when a partial discharge occurs in the converter 210, the detector 220 of FIG. 2 (or the detector 300 of FIG. 3) may detect the partial discharge. In this case, the detector 220 or 300 may detect the partial discharge in response to an input signal transmitted from the converter 210.

Next, in operation 615, the detector 220 or 300 may extract a waveform of the partial discharge. In this case, the detector 220 or 300 may extract the waveform of the partial discharge by removing a noise signal from the input signal.

Next, in operation 617, the detector 220 or 300 may determine a detection group from the waveform of the partial discharge. To this end, the detector 220 or 300 may measure a predetermined number of parameters, e.g., N parameters, from the waveform of the partial discharge. For example, the parameters may include at least one among a phase of the partial discharge, a magnitude of the partial discharge, a frequency of occurrence of the partial discharge, a maximum magnitude of the partial discharge, an average discharge amount, a firing voltage, and an extinction voltage.

The detector 220 or 300 may determine the detection group on the basis of the genetic algorithm. That is, the detector 220 or 300 may measure each of the parameters in the form of a binary number. Here, the detector 220 or 300 may measure each of the parameters in the form of a bit and express each of the parameters as 0 or 1. For example, the detector 220 or 300 may determine a bit corresponding to each of the parameters according to whether each of the parameters is greater than a predetermined threshold value. The detector 220 or 300 may determine the detection group by consecutively arranging the bits corresponding to the parameters in a predetermined order. For example, the detection group may be expressed as (0 0 1 0 1 1).

Next, in operation 619, the controller 230 may identify the partial discharge. In this case, the controller 230 may compare the detection group with the plurality of reference groups. That is, the controller 230 may determine whether the detection group is identical to one of the plurality of reference groups. When the detection group is identical to one of the plurality of reference groups, the controller 230 may check identification information of the reference group identical to the detection group. Here, the controller 230 may update the identification information of the reference group identical to the detection group. For example, when the detection group is identical to a reference group B, the controller 230 may increase a degree of risk of the reference group B.

Lastly, in operation 621, the controller 230 may diagnose a state of the display device 100 in response to the partial discharge. In this case, the controller 230 may diagnose the state of the display device 100 on the basis of the identification information of the reference group identical to the detection group. To this end, the controller 230 may predict a degree of deterioration of the converter 210 by analyzing the identification information of the reference group identical to the detection group. For example, the controller 230 predict the degree of deterioration of the converter 210 on the basis of at least one among the cause of the partial discharge, the location at which the partial discharge has occurred, and the degree of risk of the partial discharge.

The controller 230 may diagnose the degree of deterioration of the converter 210 by comparing the degree of risk of the partial discharge with at least one predetermined threshold value. For example, when the degree of risk of the partial discharge is greater than or equal to the at least one predetermined threshold value, the controller 230 may output an alarm message to repair, inspect, or replace the converter 210.

When the degree of risk of the partial discharge is greater than or equal to the at least one predetermined threshold value, the controller 230 may power off the display device 100.

When the degree of risk of the partial discharge is greater than or equal to a first threshold value and is less than a second threshold value which is greater than the first threshold value, the controller 230 may output the alarm message.

When the degree of risk of the partial discharge is greater than or equal to the second threshold value, the controller 230 may power off the display device 100. Alternatively, when the degree of risk of the partial discharge is greater than or equal to the second threshold value, the controller 230 may output the alarm message and power off the display device 100.

The display device 100 may identify the partial discharge by detecting a waveform of the partial discharge occurring in the converter 210. Thus, the display device 100 may perform a self-diagnosis in relation to the partial discharge.

In this case, the display device 100 may output the alarm message to inform a user or a manager of the display device 100 that the converter 210 needs to be repaired, inspected, or replaced.

The display device 100 may be powered off before it malfunctions.

Accordingly, the display device 100 may be prevented from malfunctioning and thus can be used for a longer time period.

As described above, a display device may identify a partial discharge by detecting a waveform of the partial discharge. That is, the display device may perform a self-diagnosis in relation to the partial discharge.

When the partial discharge is detected by performing the self-diagnosis, the display device may output an alarm message to inform a user or a manger of the display device that the display device needs to be repaired, inspected, or replaced.

Alternatively, the display device may be powered off before malfunctioning. Accordingly, the display device may be prevented from malfunctioning and thus the lifespan thereof may be improved.

The terminology used herein is for the purpose of describing particular embodiments only and is not intended to be limiting of the scopes of other embodiments. As used herein, the singular forms "a", "an" and "the" are intended to include the plural forms as well, unless the context clearly indicates otherwise. All terms (including technical and scientific terms) used herein have the same meaning as commonly understood by one of ordinary skill in the art set forth herein. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, even terms defined herein should not be understood to exclude the embodiments set forth herein.

What is claimed is:

1. A display device capable of performing a self-diagnosis in relation to a partial discharge, the di splay device comprising:
    an image processor configured to process an image signal; and
    a display unit configured to display the processed image signal,
    wherein the image processor comprises:
        a detector configured to determine a group of parameters by detecting a waveform of a detected partial discharge and measuring each of the parameters of the waveform in a form of a binary number; and
        a controller configured to identify the detected partial discharge by comparing the determined group with previously stored groups,
    wherein the controller comprises an arithmetic unit configured to update the previously stored groups by performing an operation on at least one among the previously stored groups.

2. The display device of claim 1, wherein the arithmetic unit is further configured to perform at least one of:
    a selection operation of selecting at least one first group from among the previously stored groups;
    a crossover operation of generating a second group by combining parameters of at least two groups among the previously stored groups;
    a mutation operation of generating a third group by changing at least one of parameters of the first or the second group; and
    a substitution operation of replacing one of the previously stored groups with the first group, the second group, or the third group.

3. The display device of claim 1, wherein the parameters comprise at least one of:
    a phase of the partial discharge;
    a magnitude of the partial discharge;
    a frequency of occurrence of the partial discharge;
    a maximum magnitude of the partial discharge;
    an average discharge amount;
    a firing voltage; and
    an extinction voltage.

4. The display device of claim 1, wherein the image processor further comprises a memory in which identification information of the partial discharge is mapped to each of the previously stored groups.

5. The display device of claim 4, wherein the identification information comprises at least one of:
    a cause of the partial discharge;
    a location at which the partial discharge occurs; and
    a degree of risk of the partial discharge.

6. The display device of claim 5, wherein in response to determining that the determined group is identical to a first previously stored group of the previously stored groups, the controller is configured to increase a degree of risk of the partial discharge of the first previously stored group.

7. The display device of claim 4, wherein the controller is further configured to diagnose a state of the display device on the basis of the identification information of the detected partial discharge.

8. The display device of claim 7, wherein the controller is configured to output an alarm message or power off the display device on the basis of the identification information of the detected partial discharge.

9. The display device of claim 1, wherein the detector comprises:
    a first impedance element configured to decrease an output impedance when the partial discharge occurs;
    a first condenser in which a dielectric breakdown occurs when the output impedance of the first impedance element decreases;
    a second condenser of which an output voltage increases when the dielectric breakdown occurs in the first condenser;
    a second impedance element to which the increased output voltage of the second condenser is applied; and a sensing element configured to sense the occurring partial discharge on the basis of a voltage input from the second impedance element.

10. The display device of claim 1, wherein the image processor further comprises a converter configured to output the image signal in the form of digital data to the display unit, and the detector detects a partial discharge occurring in the converter.

11. The display device of claim 1, wherein the detector is configured to determine a bit corresponding to each of the parameters according to whether each of the parameters is greater than a predetermined threshold value.

* * * * *